United States Patent [19]
Huang

[11] Patent Number: 6,078,213
[45] Date of Patent: *Jun. 20, 2000

[54] METHOD AND HARDWARE APPARATUS FOR IMPLEMENTING AN N-SAMPLE MEDIAN FILTER

[75] Inventor: Samson Huang, Cupertino, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/966,909

[22] Filed: Nov. 7, 1997

[51] Int. Cl.⁷ .............................. H03K 5/00; G06F 7/06
[52] U.S. Cl. ............................ 327/552; 327/50; 327/70; 327/63; 382/262; 708/204; 708/304
[58] Field of Search ..................... 327/551, 552, 327/50, 70, 63; 382/262; 708/204, 304, 207

[56] References Cited

U.S. PATENT DOCUMENTS 4,441,165    4/1984    Coleman et al. ................... 364/900

*Primary Examiner*—Dinh T. Le
*Attorney, Agent, or Firm*—Blakely, Sokoloff, Taylor & Zafman LLP

[57] ABSTRACT

A hardware apparatus for determining a median sample from n input samples is disclosed. The hardware apparatus includes n(n−1)/2 comparator circuits. The n(n−1)/2 comparator circuits compare each input sample with every other input sample. The comparator circuits are coupled to n−1 median selector circuits. Each median selector circuits selects a particular input sample as the median sample if the number of greater-than or equal-to comparisons for that particular input sample equals the number of less-than comparisons for that particular input sample.

11 Claims, 4 Drawing Sheets

FIGURE 3a - Median Determination Unit Truth Table

| A | B | C | D | E | F | S0 | C0 | S1 | C1 | Sa | Sb | Out |
|---|---|---|---|---|---|----|----|----|----|----|----|----|
| 0 | 0 | 0 | 0 | 0 | 0 | 0 | 0 | 0 | 0 | 0 | 0 | 0 |
| 0 | 0 | 0 | 0 | 0 | 1 | 1 | 0 | 0 | 0 | 1 | 0 | 0 |
| 0 | 0 | 0 | 0 | 1 | 0 | 1 | 0 | 0 | 0 | 1 | 0 | 0 |
| 0 | 0 | 0 | 0 | 1 | 1 | 0 | 1 | 0 | 0 | 0 | 1 | 0 |
| 0 | 0 | 0 | 1 | 0 | 0 | 1 | 0 | 0 | 0 | 1 | 0 | 0 |
| 0 | 0 | 0 | 1 | 0 | 1 | 0 | 1 | 0 | 0 | 0 | 1 | 0 |
| 0 | 0 | 0 | 1 | 1 | 0 | 0 | 1 | 0 | 0 | 0 | 1 | 0 |
| 0 | 0 | 0 | 1 | 1 | 1 | 1 | 1 | 0 | 0 | 1 | 1 | 1 |
| 0 | 0 | 1 | 0 | 0 | 0 | 0 | 0 | 1 | 0 | 1 | 0 | 0 |
| 0 | 0 | 1 | 0 | 0 | 1 | 1 | 0 | 1 | 0 | 0 | 0 | 0 |
| 0 | 0 | 1 | 0 | 1 | 0 | 1 | 0 | 1 | 0 | 0 | 0 | 0 |
| 0 | 0 | 1 | 0 | 1 | 1 | 0 | 1 | 1 | 0 | 1 | 1 | 1 |
| 0 | 0 | 1 | 1 | 0 | 0 | 1 | 0 | 1 | 0 | 0 | 0 | 0 |
| 0 | 0 | 1 | 1 | 0 | 1 | 0 | 1 | 1 | 0 | 1 | 1 | 1 |
| 0 | 0 | 1 | 1 | 1 | 0 | 0 | 1 | 1 | 0 | 1 | 1 | 1 |
| 0 | 0 | 1 | 1 | 1 | 1 | 1 | 1 | 1 | 0 | 0 | 1 | 0 |
| 0 | 1 | 0 | 0 | 0 | 0 | 0 | 0 | 1 | 0 | 1 | 0 | 0 |
| 0 | 1 | 0 | 0 | 0 | 1 | 1 | 0 | 1 | 0 | 0 | 0 | 0 |
| 0 | 1 | 0 | 0 | 1 | 0 | 1 | 0 | 1 | 0 | 0 | 0 | 0 |
| 0 | 1 | 0 | 0 | 1 | 1 | 0 | 1 | 1 | 0 | 1 | 1 | 1 |
| 0 | 1 | 0 | 1 | 0 | 0 | 1 | 0 | 1 | 0 | 0 | 0 | 0 |
| 0 | 1 | 0 | 1 | 0 | 1 | 0 | 1 | 1 | 0 | 1 | 1 | 1 |
| 0 | 1 | 0 | 1 | 1 | 0 | 0 | 1 | 1 | 0 | 1 | 1 | 1 |
| 0 | 1 | 0 | 1 | 1 | 1 | 1 | 1 | 1 | 0 | 0 | 1 | 0 |
| 0 | 1 | 1 | 0 | 0 | 0 | 0 | 0 | 0 | 1 | 0 | 1 | 0 |
| 0 | 1 | 1 | 0 | 0 | 1 | 1 | 0 | 0 | 1 | 1 | 1 | 1 |
| 0 | 1 | 1 | 0 | 1 | 0 | 1 | 0 | 0 | 1 | 1 | 1 | 1 |
| 0 | 1 | 1 | 0 | 1 | 1 | 0 | 1 | 0 | 1 | 0 | 0 | 0 |
| 0 | 1 | 1 | 1 | 0 | 0 | 1 | 0 | 0 | 1 | 1 | 1 | 1 |
| 0 | 1 | 1 | 1 | 0 | 1 | 0 | 1 | 0 | 1 | 0 | 0 | 0 |
| 0 | 1 | 1 | 1 | 1 | 0 | 0 | 1 | 0 | 1 | 0 | 0 | 0 |
| 0 | 1 | 1 | 1 | 1 | 1 | 1 | 1 | 0 | 1 | 1 | 0 | 0 |

FIGURE 3b - Median Determination Unit Truth Table (continued)

| | | | | | | | | | | | | |
|---|---|---|---|---|---|---|---|---|---|---|---|---|
| 1 | 0 | 0 | 0 | 0 | 0 | 0 | 0 | 1 | 0 | 1 | 0 | 0 |
| 1 | 0 | 0 | 0 | 0 | 1 | 1 | 0 | 1 | 0 | 0 | 0 | 0 |
| 1 | 0 | 0 | 0 | 1 | 0 | 1 | 0 | 1 | 0 | 0 | 0 | 0 |
| 1 | 0 | 0 | 0 | 1 | 1 | 0 | 1 | 1 | 0 | 1 | 1 | 1 |
| 1 | 0 | 0 | 1 | 0 | 0 | 1 | 0 | 1 | 0 | 0 | 0 | 0 |
| 1 | 0 | 0 | 1 | 0 | 1 | 0 | 1 | 1 | 0 | 1 | 1 | 1 |
| 1 | 0 | 0 | 1 | 1 | 0 | 0 | 1 | 1 | 0 | 1 | 1 | 1 |
| 1 | 0 | 0 | 1 | 1 | 1 | 1 | 1 | 1 | 0 | 0 | 1 | 0 |
| 1 | 0 | 1 | 0 | 0 | 0 | 0 | 0 | 0 | 1 | 0 | 1 | 0 |
| 1 | 0 | 1 | 0 | 0 | 1 | 1 | 0 | 0 | 1 | 1 | 1 | 1 |
| 1 | 0 | 1 | 0 | 1 | 0 | 1 | 0 | 0 | 1 | 1 | 1 | 1 |
| 1 | 0 | 1 | 0 | 1 | 1 | 0 | 1 | 0 | 1 | 0 | 0 | 0 |
| 1 | 0 | 1 | 1 | 0 | 0 | 1 | 0 | 0 | 1 | 1 | 1 | 1 |
| 1 | 0 | 1 | 1 | 0 | 1 | 0 | 1 | 0 | 1 | 0 | 0 | 0 |
| 1 | 0 | 1 | 1 | 1 | 0 | 0 | 1 | 0 | 1 | 0 | 0 | 0 |
| 1 | 0 | 1 | 1 | 1 | 1 | 1 | 1 | 0 | 1 | 1 | 0 | 0 |
| 1 | 1 | 0 | 0 | 0 | 0 | 0 | 0 | 0 | 1 | 0 | 1 | 0 |
| 1 | 1 | 0 | 0 | 0 | 1 | 1 | 0 | 0 | 1 | 1 | 1 | 1 |
| 1 | 1 | 0 | 0 | 1 | 0 | 1 | 0 | 0 | 1 | 1 | 1 | 1 |
| 1 | 1 | 0 | 0 | 1 | 1 | 0 | 1 | 0 | 1 | 0 | 0 | 0 |
| 1 | 1 | 0 | 1 | 0 | 0 | 1 | 0 | 0 | 1 | 1 | 1 | 1 |
| 1 | 1 | 0 | 1 | 0 | 1 | 0 | 1 | 0 | 1 | 0 | 0 | 0 |
| 1 | 1 | 0 | 1 | 1 | 0 | 0 | 1 | 0 | 1 | 0 | 0 | 0 |
| 1 | 1 | 0 | 1 | 1 | 1 | 1 | 1 | 0 | 1 | 1 | 0 | 0 |
| 1 | 1 | 1 | 0 | 0 | 0 | 0 | 0 | 1 | 1 | 1 | 1 | 1 |
| 1 | 1 | 1 | 0 | 0 | 1 | 1 | 0 | 1 | 1 | 0 | 1 | 0 |
| 1 | 1 | 1 | 0 | 1 | 0 | 1 | 0 | 1 | 1 | 0 | 1 | 0 |
| 1 | 1 | 1 | 0 | 1 | 1 | 0 | 1 | 1 | 1 | 0 | 0 | 0 |
| 1 | 1 | 1 | 1 | 0 | 0 | 1 | 0 | 1 | 1 | 0 | 1 | 0 |
| 1 | 1 | 1 | 1 | 0 | 1 | 0 | 1 | 1 | 1 | 0 | 0 | 0 |
| 1 | 1 | 1 | 1 | 1 | 0 | 0 | 1 | 1 | 1 | 0 | 0 | 0 |
| 1 | 1 | 1 | 1 | 1 | 1 | 1 | 1 | 1 | 1 | 0 | 0 | 0 |

METHOD AND HARDWARE APPARATUS FOR IMPLEMENTING AN N-SAMPLE MEDIAN FILTER

FIELD OF THE INVENTION

The present invention relates to the field of digital electronic circuits. More specifically the present invention relates to an electronic circuit for implementing an N-sample Median Filter.

BACKGROUND OF THE INVENTION

A median value is the value in a set where there are an equal number of values above and below. For example, in the set consisting of the values 1, 3, 4, 7, and 9, the value "4" is the median value since there is an equal number of values above (two values consisting of "7" and "9") as there are below (two values consisting of "1" and "3").

The median value is used in numerous statistical operations. It would therefore be desirable to have a median hardware circuit that can quickly an efficiently calculate the median value from a set of values. Furthermore, it would be desirable if this median hardware circuit used a minimal number of gates to minimize the hardware implementation cost.

SUMMARY OF THE INVENTION

A hardware apparatus for determining a median sample from n input samples is disclosed. The hardware apparatus includes n(n−1)/2 comparator circuits. The n(n−1)/2 comparator circuits compare each input sample with every other input sample. The comparator circuits are coupled to n−1 median selector circuits. Each median selector circuits selects a particular input sample as the median sample if the number of greater-than or equal-to comparisons for that particular input sample equals the number of less-than comparisons for that particular input sample.

Other objects, features, and advantages of present invention will be apparent from the company drawings and from the following detailed description that follows below.

BRIEF DESCRIPTION OF THE DRAWINGS

The objects, features and advantages of the present invention will be apparent to one skilled in the art, in view of the following detailed description in which:

FIGS. 3a and 3b illustrates the truth table of the median determination circuit of FIG. 2.

DETAILED DESCRIPTION

Figure 1:
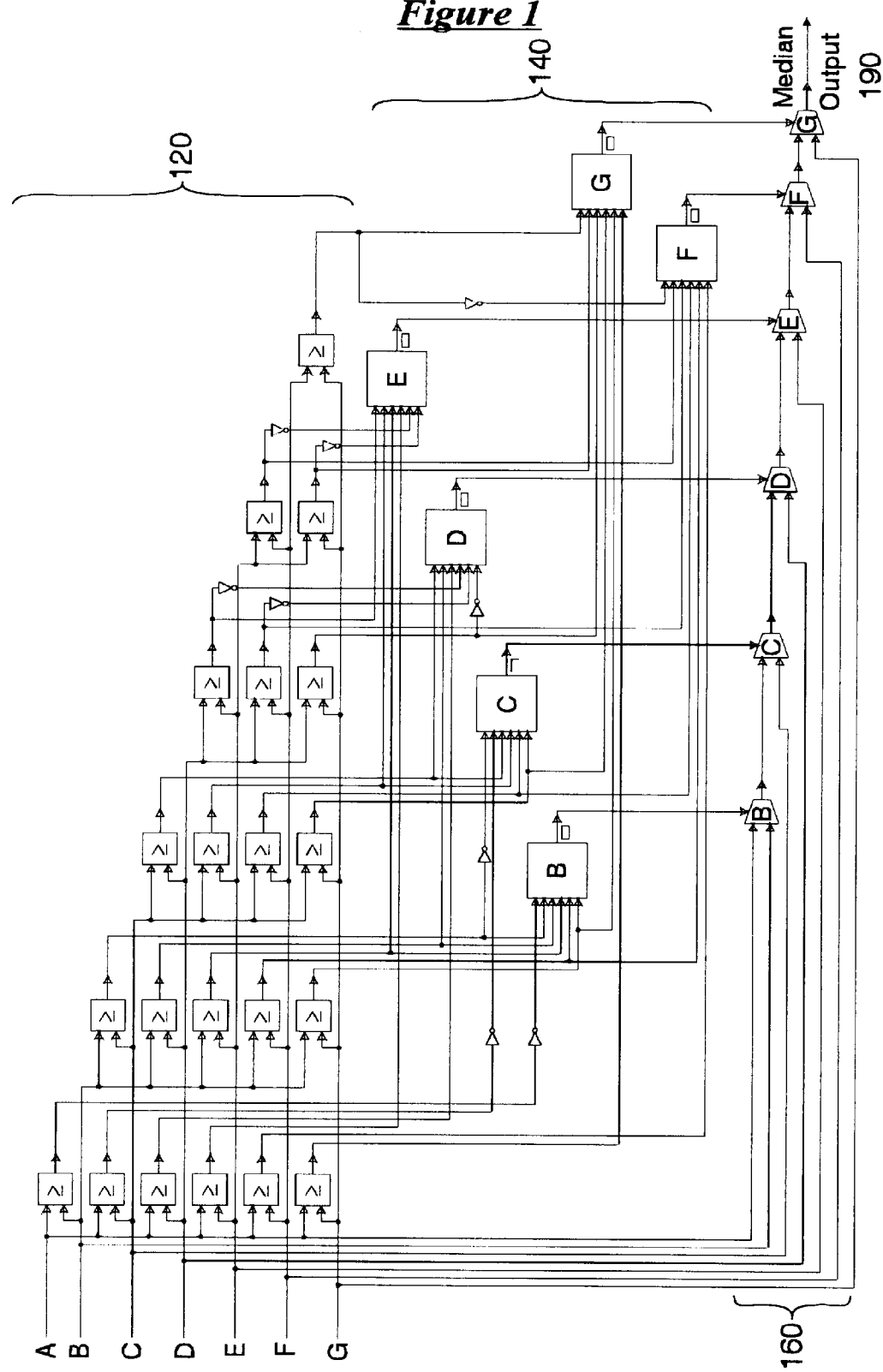
FIG. 1 illustrates a block diagram of a seven-sample median filter circuit.

A method and apparatus for implementing an n-sample median filter is disclosed. In the following description, for purposes of explanation, specific nomenclature is set forth to provide a thorough understanding of the present invention. However, it will be apparent to one skilled in the art that these specific details are not required in order to practice the present invention. For example, the present invention is described with reference to a video processing application that uses a seven sample median filter. However, the teachings of the present invention can easily be applied to other types of applications. Furthermore, median filters can be constructed that select the median between any number of samples.

An N-Sample Median Filter

An n-sample median filter selects the "middle" value from the n samples that are provided. For example, in the set consisting of the values 1, 3, 4, 7, and 9, the value "4" is the median value since there is an equal number of values above and below the value "4".

Median filters are often used in image processing and digital video applications. For example, a median filter can be used to select the median value of a group of pixels in order to perform anti-aliasing.

Similarly, a median filter can be used to fill alternate scan lines in a video line-doubler by selecting a median pixel from neighboring pixels. National Television Standards Committee (NTSC) video is constructed of alternating odd and even fields of scan lines. The odd and even scan lines are alternatingly displayed in an interlaced manner to display a full motion video. A pair of consecutive (odd and even) video fields are often referred to as a video frame. To display an interlaced video image on a computer monitor, the interlaced video must first be de-interlaced since computer monitors display information in a progressive format where every line is scanned each frame. Specifically, an odd video field consisting of only odd scan lines must have the missing even scan lines filled and an even video field consisting of only even lines must have all the odd scan lines filled. This process is known as line doubling. An example use of the n-sample median filter of the present invention can be found in the copending related U.S. patent application entitled "Method and Apparatus for De-Interlacing Video Fields For Superior Edge Preservation", filed Nov. 7, 1997, having docket number 42390.P4459 that is hereby incorporated by reference.

A Prior Art N-Sample Median Filter

In an n-sample median filter, the number of possible comparison results can be determined as follows: The smallest sample may be any one of the seven samples, thus there are seven possibilities. The second smallest sample can be any of the remaining six samples, thus there are six possibilities. The third smallest sample may be any of the five remaining samples. Similarly, there are 4 possibilities for the fourth smallest sample, 3 possibilities for the fifth smallest sample, 2 possibilities for the sixth smallest sample, and only 1 possibility for the seventh smallest (the largest) sample. In summary, the total number of possible comparison results is 7*6*5*4*3*2*1=7!=5040. Thus, in general, an n-sample comparator generates n! different possible results.

Conventionally, an n-sample media filter would examine all n! results and select the median sample in each of the n! cases. In the example of a 7-sample median filter, the hardware would need to consider 5040 different possible cases. Such a filter would require a very large number of gates to implement.

An Improved N-Sample Median Filter

To improve on the prior art, the present invention introduces an n-sample median filter that uses fewer gates. Specifically, to implement an n-sample median filter the present invention introduces a circuit that requires only N(N−1)/2 comparators in order to compare N samples at the same time to determine the median. For example, a 7-sample median filter would only require 7*6/2=21 comparators.

The Overall Median Filter Circuit

FIG. 1 illustrates a block diagram of one embodiment of the median filter circuit of the present invention. The embodiment of FIG. 1 illustrates a seven sample median filter, however the same teachings can be used to implement median filters that determine the median of other numbers of samples.

Referring to FIG. 1, seven samples (A, B, C, D, E, F, and G) are input from the left. The seven input samples are analyzed by an array of twenty-one comparators 120 that compare every input sample with every other input sample. Specifically, the comparators 120 determine if a first input sample is greater-than or equal-to second input sample. If the first input sample is greater-than or equal-to the second sample then a true ("1") value is output. Otherwise, if the first input sample is less-than the second sample then a false ("0") value is output.

The results from the twenty-one comparators 120 are then provided to six median determination circuits 140 (B, C, D, E, F, and G). The median determination circuits examine the six comparisons for one particular input sample to determine if the number of greater-than or equal-to comparisons equal the number of less-than comparisons. If there are an equal number of greater-than or equal-to comparisons and less-than comparisons, then the sample is the median value. For example, in the four sample set of values 1, 3, 4, 7, and 9, the value "4" is the median value since there are two greater-than or equal-to comparisons ($4 \geq 1$ and $4 \geq 3$) and two less-than comparisons ($4 < 7$ and $4 < 9$). Referring back to FIG. 1, each median determination circuit controls one of the median pass-through multiplexors 160.

Referring to FIG. 1, median determination circuit G determines if sample g should be selected as the median. Thus, the output of the comparisons of g versus f, g versus e, g versus d, g versus c, g versus b, and g versus a are considered by median determination circuit G. If G is determined to be the median (since there are an equal number of comparisons above and below) then median determination circuit G directs median pass-through multiplexor G to output g as the median value.

If median determination circuit G does not determine that sample G is the median, then median pass-through multiplexor G passes through a median value selected by another median determination circuit. Specifically, in FIG. 1, multiplexor F controlled by median determination circuit F will output F as the median if sample F is the median value. If sample F is not the median value, then multiplexor F passes through a median value selected by another median determination circuit. This chain of median determination circuits and median pass-through multiplexors continues along and may select samples D, C, or B. Sample A is selected as a default median if none of the six median determination circuits 140 (B, C, D, E, F, and G) detects its sample as the median value.

The median determination circuit

As previously set forth, the present invention uses a median determination circuit to determine if a particular sample is the median value. The median determination circuit operates by determining if the sample there are an equal number of greater-than or equal-to comparisons and less-than comparisons for the particular sample.

Figure 2:
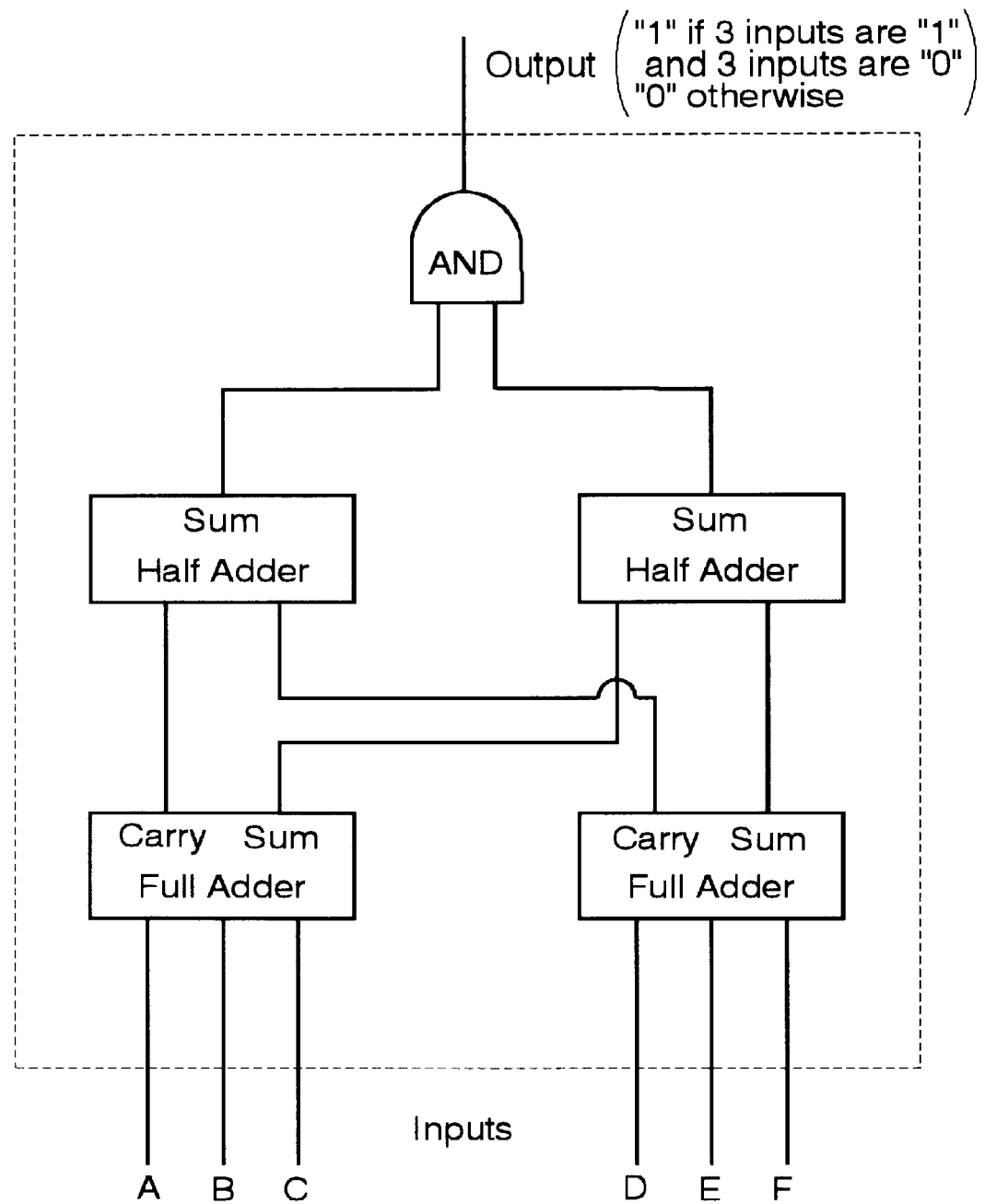
FIG. 2 illustrates a block diagram of a median determination circuit.

FIG. 2 illustrates the internal operation of a median determination circuit for a seven sample median filter. The seven sample median determination circuit is constructed using two three-input full adders, two two-input half adders, and an AND gate. The inputs of the two three-input full adders are coupled to the six comparisons for one of the samples. The sum bits from the two three-input full adders are coupled to a first half adder. The carry bits from the two three-input full adders are coupled to a second first adder. Finally, the outputs from the two half adders are logically ANDed together by the AND gate.

The logic of FIG. 2 outputs a "1" value if three inputs are "1" (three comparisons are greater-than or equal-to) and three comparison inputs are "0" (three comparisons are less-than). A truth table for the median determination circuit is presented in FIGS. 3a and 3b.

The foregoing has disclosed an n-sample median filter apparatus. It is contemplated that changes and modifications may be made by one of ordinary skill in the art, to the materials and arrangements of elements of the present invention without departing from the scope of the invention.

We claim:

1. A method of determining a median sample from a set of n input different samples, wherein n is greater than 3, said method comprising:

comparing a first sample of said set of n different samples, with all other samples in said set of n input different samples to determine a first comparison output or a first false comparison output for each pairing of said set of said n input different samples; and selecting said first sample as said median sample when a number of said first true comparison outputs equals a number of said first false comparison outputs for comparisons involving said first sample.

2. The method as claimed in claim 1 further comprising:

comparing a second sample of said set of n input different samples with all other samples in said set of and a second false comparison output different samples to determine a second true comparison output for each pairing of said set of n input different samples; and selecting said second sample as said median sample when a number of said second true comparison outputs equals a number of said second false comparison outputs for comparisons involving said second sample.

3. The method as claimed in claim 2 further comprising:

comparing a third sample of said set of said n input different samples with all other samples in said set of said n input different samples to determine a third true comparison output and a third false comparison output for each pairing of said set of said n input different samples; and selecting said third sample as said median sample when a number of said third true comparison outputs equals number of said third false comparison outputs for comparisons involving said third sample.

4. The method as claimed in claim 1 wherein said comparing step further comprises determining whether a first value of said first sample is greater-than or equal-to a second value of said second sample.

5. The method as claimed in claim 1 wherein said set of n input different video pixel values.

6. The method as claimed in claim 1 wherein said selecting step is performed in a circuit having two three-input full adders, two two-input half adders, and an AND gate.

7. An apparatus for determining a median sample from a set of n input samples, wherein n is a variable and greater than 3, said apparatus comprising:

n(n−1)/2 comparators, each of said n(n−1)/2 comparators comparing each input sample in said set of n input samples with each other input sample in said set of n input samples to provide a true comparison output or a false comparison output; and n−1 median selector circuits, each median selector circuit coupled to n−1 comparators that involve an associated input sample from said set of n input samples, each of said median selector circuits selecting said associated input sample as said median sample when a number of said true comparison outputs equals a number of said false comparison outputs for said (n−1) comparators that involve said associated input sample.

8. The apparatus as claimed in claim 7 further comprising:

n−1 median pass-through multiplexors, each said median pass-through multiplexors corresponding to one of said median selector circuits, said median pass-through multiplexor passing through said associated input sample as said median sample when said number of said true comparison outputs equals said number of said false comparison outputs for said (n−1) comparators that involve said associated input sample.

9. The apparatus as claimed in claim 7 wherein said comparators perform a greater-than of equal-to comparison.

10. The apparatus as claimed in claim 7 wherein said set of n different samples comprise n different video pixel values.

11. The apparatus as claimed in claim 7 wherein said median selector circuits comprise two three-input full adders, two two-input half adders, and an AND gate.

* * * * *

UNITED STATES PATENT AND TRADEMARK OFFICE
CERTIFICATE OF CORRECTION

PATENT NO.    : 6,078,213
DATED         : June 20, 2000
INVENTOR(S)   : Huang

It is certified that error appears in the above-identified patent and that said Letters Patent is hereby corrected as shown below:

Column 1,
Line 21, delete "an", insert -- and --.
Line 39, delete "company", insert -- accompanying --.
Line 51, delete "illustrates", insert -- illustrate --.

Column 4,
Line 53, between "different" and "video" insert -- samples comprise n different --.

Column 6,
Line 4, delete "of", insert -- or --.

Signed and Sealed this

Eleventh Day of February, 2003

JAMES E. ROGAN
*Director of the United States Patent and Trademark Office*